US008208336B2

(12) United States Patent
Do

(10) Patent No.: US 8,208,336 B2
(45) Date of Patent: Jun. 26, 2012

(54) FUSE CIRCUIT AND SEMICONDUCTOR DEVICE HAVING THE SAME

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 415 days.

(21) Appl. No.: 12/495,015

(22) Filed: Jun. 30, 2009

(65) Prior Publication Data

US 2010/0277999 A1 Nov. 4, 2010

(30) Foreign Application Priority Data

Apr. 30, 2009 (KR) ........................ 10-2009-0038412

(51) Int. Cl.
*G11C 17/18* (2006.01)

(52) U.S. Cl. ............. 365/225.7; 365/210.1; 365/189.07; 365/189.06

(58) Field of Classification Search ............... 365/225.7, 365/189.06, 189.07, 210.1
See application file for complete search history.

(56) References Cited

U.S. PATENT DOCUMENTS

| | | | | |
|---|---|---|---|---|
| 6,087,889 | A * | 7/2000 | Mok | 327/525 |
| 7,379,357 | B2 * | 5/2008 | Kang | 365/200 |
| 7,489,180 | B2 * | 2/2009 | Marshall | 327/525 |
| 7,742,352 | B1 * | 6/2010 | Hara et al. | 365/210.1 |
| 7,936,582 | B1 * | 5/2011 | Zhou et al. | 365/96 |
| 2011/0080773 | A1 * | 4/2011 | El Baraji et al. | 365/158 |

FOREIGN PATENT DOCUMENTS

| | | |
|---|---|---|
| KR | 100287541 | 4/2001 |
| KR | 1020020039574 | 5/2002 |
| KR | 100480906 | 7/2005 |
| KR | 1020060074319 | 7/2006 |

OTHER PUBLICATIONS

Notice of Preliminary Rejection issued from Korean Intellectual Property Office on Nov. 12, 2010.

* cited by examiner

*Primary Examiner* — Pho M Luu
(74) *Attorney, Agent, or Firm* — IP & T Group LLP

(57) ABSTRACT

A fuse circuit includes a fuse unit configured to drive an output terminal via a current path including a fuse in response to a fuse enable signal; and a comparison unit configured to be activated in response to an activation signal for comparing a reference voltage having a predetermined level with a voltage level of the output terminal to generate a fuse state signal.

34 Claims, 11 Drawing Sheets

450
FOUT
VREF
VDD
VSS
SA_EN
430
VDD
PM0
COM
PCGB
410
412
414
Fn
F2
F1
F0
NMn
NM2
NM1
NM0
<n>
<2>
<1>
<0>
VSS
EN_ADD<0:n>

FOUT
VREF
450
VDD
VSS
SA_EN
610
INV3
VDD
PM1
430
VDD
PM0
COM
PCGB
410
412
414
Fn
F2
F1
F0
NMn
NM2
NM1
NM0
<n>
<2>
<1>
<0>
VSS
EN_ADD<0:n>

890
450
VDD
FOUT
OUT2
VSS
SA_EN
430
VDD
PM0
COM
OUT1
410
412
414
Fn
NMn
<n>
F2
NM2
<2>
F1
NM1
<1>
F0
NM0
<0>
VSS
EN_ADD<0:n>

450
FOUT
OUT2
VDD
VSS
SA_EN
1310
INV3
VDD
PM2
PM1
430
VDD
PM0
COM
SEL_MOD
OUT1
410
412
414
Fn
F2
F1
F0
NMn
NM2
NM1
NM0
<n>
<2>
<1>
<0>
VSS
EN_ADD<0:n>

FUSE CIRCUIT AND SEMICONDUCTOR DEVICE HAVING THE SAME

CROSS-REFERENCE TO RELATED APPLICATIONS

The present application claims priority of Korean patent application number 10-2009-0038412, filed on Apr. 30, 2009, which is incorporated by reference in its entirety.

BACKGROUND OF THE INVENTION

The present invention relates to a semiconductor design technology, and more particularly, to a fuse circuit for performing various circuit operations by using a fuse and a semiconductor device having the same.

Generally, with the rapid increase in the degree of integration of a semiconductor device such as a Double Data Rate Synchronous Dynamic Random Access Memory (DDR SDRAM), several thousands to tens of thousands of memory cells are being provided in one semiconductor device. If a defect is present in any one of the memory cells, the relevant semiconductor device may not perform a desired operation. However, with the progress of processing technologies of semiconductor devices, only a small number of memory cells in a semiconductor device may be defective. Thus, it is very ineffective from the standpoint of product yield to discard a semiconductor device as a defective product due to a defect in some memory cells. To overcome this problem, a semiconductor device is further provided with redundancy memory cells, as well as normal memory cells. If a defect is present in the normal memory cells, they are replaced by redundancy memory cells for use. Hereinafter, for illustration purposes, defective memory cells among the normal memory cells that should be replaced by redundancy memory cells will be referred to as "memory cells in need of repair".

Here, address information corresponding to the memory cells in need of repair is provided by a redundancy circuit, in which the redundancy circuit is provided with a plurality of fuses for programming address information of the memory cells in need of repair. Thus, the redundancy circuit generates address information programmed in the fuses, i.e., repair information signals. The semiconductor device compares the repair information signals with address information applied during read and write operations, and if the memory cells in need of repair are accessed, performs an operation to access the redundancy memory cells instead of the memory cells in need of repair.

For reference, an electrical cutting method, a laser cutting method, or the like is used to program the plurality of fuses provided in the redundancy circuit. The electrical cutting method is a method of applying an overcurrent to a fuse to be cut to melt and cut it, and the laser cutting method is a method of applying a laser beam to the fuse to blow and cut it. In general, the laser cutting method is widely used because it is simpler than the electrical cutting method.

Meanwhile, fuses are used to perform various operations in semiconductor device, as well as in the above-explained redundancy circuit. For example, fuses are used to tune a voltage in a constant voltage generating circuit that operates sensitively to a process, or used in various ways in a control circuit for testing or a control circuit for selecting various modes, or the like. In the following, a description will be made by taking a redundancy circuit as an example for illustration purposes.

FIG. 1 is a circuit diagram illustrating a conventional redundancy circuit.

Referring to FIG. 1, the conventional redundancy circuit includes a fuse unit 110, a latching unit 130, a precharging unit 150, and a repair information output unit 170.

The fuse unit 110 is for driving a common node COM serving as an output terminal via a current path including a fuse in response to a fuse enable signal EN_ADD<0:n> (where n is a natural number), and is provided with a plurality of fuses 112 and a plurality of activation portions 114.

The fuses 112 are for programming address information corresponding to memory cells in need of repair, and are composed of 0-th to n-th fuses F0, F1, F2, . . . , Fn. The activation portions 114 are for receiving respective fuse enable signals EN_ADD<0:n> and establishing pull-down current paths including the corresponding fuses, and are composed of 0-th to n-th NMOS transistors NM0, NM1, NM2, . . . , NMn. Here, the fuse enable signals EN_ADD<0:n> are signals generated by decoding addresses applied from the outside, and are activated correspondingly to a memory cell mat selected during read and write operations of the semiconductor device. For reference, the memory cell matrix ("MAT") means a set of grouped memory cells among a plurality of memory cells. The 0-th to n-th fuse enable signals EN_ADD<0:n> are activated correspondingly to a memory cell mat including memory cells desired to be accessed.

The latching unit 130 is for latching a logic level value depending on the common node COM driven in response to the 0-th to n-th fuse enable signals EN_ADD<0:n>, and is provided with two inverters INV0 and INV1.

The precharging unit 150 is for setting an initial logic level value of the latching unit 130, and has a source-drain path formed between an external power supply voltage VDD terminal and the common node COM and a 0-th PMOS transistor PM0 receiving a precharging signal PCGB via the gate. Here, the precharging signal PCGB is a signal which makes a transition from logic 'low' to logic 'high' during an active operation, a read operation, or a write operation.

The repair information output unit 170 is for receiving an output signal from the latching unit 130 and outputting a repair information signal FOUT, and is provided with a second inverter INV2. Here, the repair information signal FOUT includes address information of the memory cells in need of repair that are programmed in the fuses, and the semiconductor device determines whether a memory cell desired to be accessed is a memory cell in need of repair or not in response to the repair information signal FOUT.

FIGS. 2 and 3 are timing diagrams for explaining an operation of the redundancy circuit of FIG. 1. For illustration purposes, operations of the redundancy circuit upon activation of the 0-th fuse enable signal EN_ADD<0> when the 0-th fuse F0 is cut and when the 0-th fuse F0 is not cut will be discussed.

Referring to FIGS. 1 and 2, firstly, the common node COM is precharged in response to a precharging signal PCGB of logic 'low', and thus the latching unit 130 latches logic 'high'. Afterwards, the precharging signal PCGB is transited from logic 'low' to logic 'high' during an active operation, a read operation, or a write operation, and the 0-th fuse enable signal EN_ADD<0> is activated to logic 'high'. Next, the 0-th NMOS transistor NM0 is turned on in response to the 0-th fuse enable signal EN_ADD<0>.

If the 0-th fuse F0 is not cut, a pull-down current path is formed between the common node COM and a ground power supply voltage VSS terminal. Thus, a voltage level of the common node COM becomes lower than a threshold voltage value of the 0-th inverter INV0, thereby rendering the repair information signal FOUT be logic 'low'. Next, if the 0-th fuse F0 is cut, the common node COM is kept at logic 'high' by virtue of the latching unit 130. That is, since a pull-up current path is formed by the first inverter INV1, the common node COM is kept at logic 'high', thus rendering the repair information signal FOUT be logic 'high'. The semiconductor device receives address information of memory cells in need of repair by using the repair information signal FOUT of logic 'high' or logic 'low'.

FIG. 3 is a timing diagram for explaining a deficiency in the operation of the conventional redundancy circuit of FIG. 1. It is ideal for a fuse to have a high resistance state and a low resistance state depending on whether or not the fuse is cut, in which the corresponding operation timing is as shown in FIG. 2. That is, even if the fuse is substantially cut, the fuse may not be kept at a stable high resistance state, and even if the fuse is cut, the fuse may not be kept a stable low resistance state due to the occurrence of an abnormal phenomenon, such as a crack. In other words, the resistance state of the fuse may be less accurate.

As can be seen from FIG. 3, if the resistance state of the 0-th fuse F0 is inaccurate, even if the 0-th NMOS transistor NM0 is turned on in response to the 0-th fuse enable signal EN_ADD<0>, the common node COM does not become desired logic 'low or 'high' within a predetermined time. Here, the voltage level of the common node COM and the threshold voltage $V_{LT}$ of the 0-th inverter INV0 have a close relation in determining the logic level of the repair information signal FOUT. Due to this, the inaccurate resistance state of the 0-th fuse F0 causes the problem of making the activation time point of the repair information signal FOUT incorrect.

Moreover, the threshold voltage $V_{LT}$ of the 0-th inverter INV0 may vary depending on the surrounding environment of the semiconductor device. This may act adversely in accurately determining the repair information signal FOUT depending on whether the 0-th fuse F0 is cut or not. In other words, if the 0-th fuse F0 is not cut, the repair information signal FOUT may be outputted wrongly as logic 'high', or if the 0-th fuse F0 is cut, the repair information signal FOUT may be outputted wrongly as logic 'low'. That is, the reliability of the repair information signal FOUT is deteriorated, which may cause a malfunction in the repair operation of the semiconductor device.

SUMMARY OF THE INVENTION

An embodiment of the present invention is directed to providing a fuse circuit which can compare an output terminal driven by a current path including a fuse with a predetermined voltage level.

Another embodiment of the present invention is directed to providing a semiconductor device which can measure a resistance value of a fuse.

In accordance with an embodiment of the present invention, there is provided a fuse circuit including a fuse unit configured to drive an output terminal via a current path including a fuse in response to a fuse enable signal; and a comparison unit configured to be activated in response to an activation signal for comparing a reference voltage having a predetermined level with a voltage level of the output terminal to generate a fuse state signal.

The fuse unit may include a plurality of fuses configured to program desired information; and a plurality of activation portions configured to be connected to the corresponding plurality of fuses, respectively, for activating the plurality of fuses in response to the fuse enable signal.

The comparison unit may be a latched differential sense amplifier.

The fuse circuit may further include an auxiliary level maintaining unit configured to maintain the output terminal at a predetermined level.

The auxiliary level maintaining unit is configured to drive the output terminal by a predetermined driving current.

The fuse circuit may further include a precharging unit configured to precharge the output terminal in response to a precharging signal.

The auxiliary level maintaining unit may be configured to precharge the output terminal in an interval where the precharging signal is activated.

The activation signal may be activated after the precharging signal is deactivated and the fuse enable signal may be activated.

In accordance with another embodiment of the present invention, there is provided a fuse circuit including a fuse circuit configured to compare a voltage level of an output terminal driven through a current path including a fuse with a measured reference voltage to generate a fuse state signal in response to a fuse enable signal; and a fuse replica modeling unit configured to generate the measured reference voltage having a voltage level corresponding to a measured resistance value of the fuse.

The fuse circuit may include a fuse unit configured to drive the output terminal through a current path including the fuse in response to the fuse enable signal; an output terminal driving unit configured to perform a biasing operation on the output terminal in response to a bias voltage; and a comparison unit configured to be activated in response to an activation signal for comparing the measured reference voltage with a voltage level of the output terminal to generate the fuse state signal.

The fuse unit may include a plurality of fuses configured to program desired information; and a plurality of activation portions configured to be connected to the corresponding fuses, respectively, for activating the fuses in response to the fuse enable signal.

The comparison unit may be a latched differential sense amplifier.

The semiconductor device may further include an auxiliary level maintaining unit configured to maintain the output terminal at a predetermined level.

The fuse replica modeling unit may include a replica resistor portion configured to drive a replica output terminal via a current path including replica resistors to generate the measured reference voltage in response to a resistance value selection signal; and a replica biasing portion configured to perform a biasing operation on the replica output terminal in response to the bias voltage.

The replica resistor portion may include: a plurality of replica resistors configured to correspond to the measured resistance value; and a plurality of replica activation elements configured to be connected to the corresponding replica resistors, respectively, for activating the replica resistors in response to the resistance value selection signal.

In accordance with another embodiment of the present invention, there is provided a fuse circuit including a reference voltage generating unit configured to generate a bias voltage and a comparison reference voltage; a first multiplexing unit configured to output a precharging signal or the bias voltage in response to a mode selection signal; a fuse replica modeling unit configured to receive the bias voltage and generating a measured reference voltage having a voltage level corresponding to a measured resistance value in response to a resistance value selection signal; a second multiplexing unit configured to output the comparison reference voltage or the measured reference voltage in response to the mode selection signal; and a fuse circuit configured to receive an output signal of the first multiplexing means and comparing a voltage level of an output terminal driven through a current path including a fuse with an output signal of the second multiplexing means to generate a fuse state signal in response to a fuse enable signal.

The bias voltage and the comparison reference voltage may have a predetermined voltage level.

The mode selection signal may be a signal corresponding to a normal mode and a measurement mode.

The fuse replica modeling unit may include a replica resistor portion configured to drive a replica output terminal through a current path including replica resistors to generate the measured reference voltage in response to the resistance value selection signal; and a replica biasing portion configured to perform a biasing operation on the replica output terminal in response to the bias voltage.

The replica resistor portion may include a plurality of replica resistors configured to correspond to the measured resistance value; and a plurality of replica activation elements configured to be connected to the corresponding replica resistors, respectively, for activating the replica resistors in response to the resistance value selection signal.

The fuse circuit may include a fuse unit configured to drive the output terminal through a current path including the fuse in response to the fuse enable signal; an output terminal driving unit configured to perform a precharging or biasing operation on the output terminal in response to an output signal of the first multiplexing unit; and a comparison unit configured to be activated in response to an activation signal for comparing an output signal of the second multiplexing unit with a voltage level of the output terminal to generate a fuse state signal.

The output terminal driving unit may be configured to perform a biasing operation on the output terminal in response to the bias voltage, and a precharging operation on the output terminal in response to the precharging signal.

The fuse unit may include a plurality of fuses configured to program desired information; and a plurality of activation portions configured to be connected to the corresponding fuses, respectively, for activating the fuses in response to the fuse enable signal.

The comparison unit may be a latched differential sense amplifier.

The semiconductor device may further including an auxiliary level maintaining unit configured to maintain the output terminal at a predetermined level in response to the mode selection signal.

The auxiliary level maintaining unit may maintain the output terminal at a predetermined driving current.

The activation signal may be activated after the precharging signal is deactivated and the fuse enable signal is activated.

The semiconductor device may further include an auxiliary level maintaining unit configured to maintain the output terminal at a predetermined level in response to the mode selection signal.

The auxiliary level maintaining unit may be configured to maintain the output terminal at a predetermined driving current.

In accordance with another embodiment of the present invention, there is provided a method for driving a semiconductor device including: comparing a voltage level of an output terminal driven through a current path including a fuse programmed with desired information with a predetermined comparison reference voltage to output a result of whether the fuse is cut or uncut in a normal mode; and performing a biasing operation on the output terminal to output a result corresponding to a resistance value of the fuse in a measurement mode.

Comparing a voltage level of an output terminal may include performing a precharging operation on the output terminal in response to a precharging signal; activating the fuse to drive the output terminal in response to a fuse enable signal; and comparing a voltage level of the output terminal with the comparison reference voltage to output a comparison result in response to an activation signal.

The activation signal may be activated after the precharging signal is deactivated.

Performing a biasing operation on the output terminal may include activating the fuse in response to a fuse enable signal; generating a measured reference value having a voltage level corresponding to a measured resistance value; and comparing a voltage level of the output terminal with the measured reference voltage to output a comparison result in response to an activation signal.

The activation signal may be activated after the fuse enable signal is activated.

Generating a measured reference value may include activating a replica resistor corresponding to the measured resistance value in response to a resistance value selection signal; and generating the measured reference value through a current path including an activated replica resistor.

In the present invention, an output terminal driven by a current path including a fuse can be compared with a predetermined voltage level, and whether or not the fuse is cut can be accurately detected at a predetermined time point. The result so detected can guarantee a correct output result corresponding to the cutting or not of a programmed fuse by supplementing the fuse or varying the reference voltage. Further, since the resistance value of the fuse can be accurately measured, a fast circuit analysis can be enabled.

DESCRIPTION OF SPECIFIC EMBODIMENTS

Hereinafter, the most preferred embodiment of the present invention will be described in detail with reference to the accompanying drawings so that the invention can be easily practiced by those skilled in the art to which the invention pertains.

Figure 1:
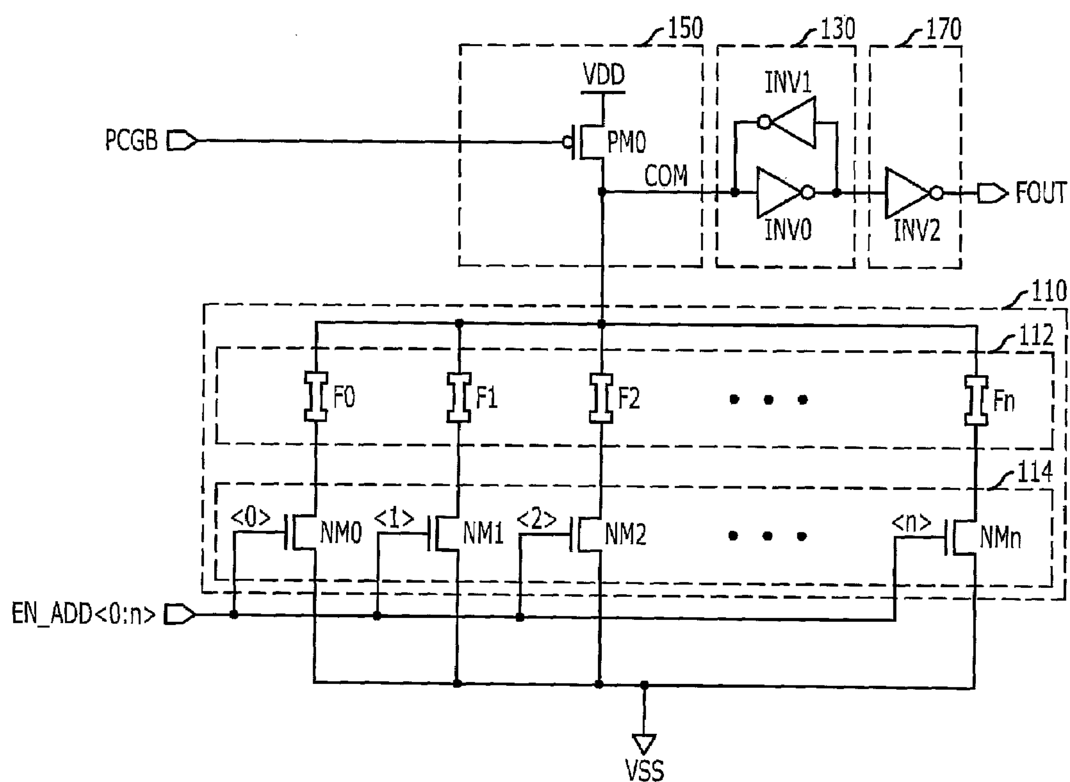
FIG. 1 is a circuit diagram illustrating a conventional redundancy circuit.
Figure 2:
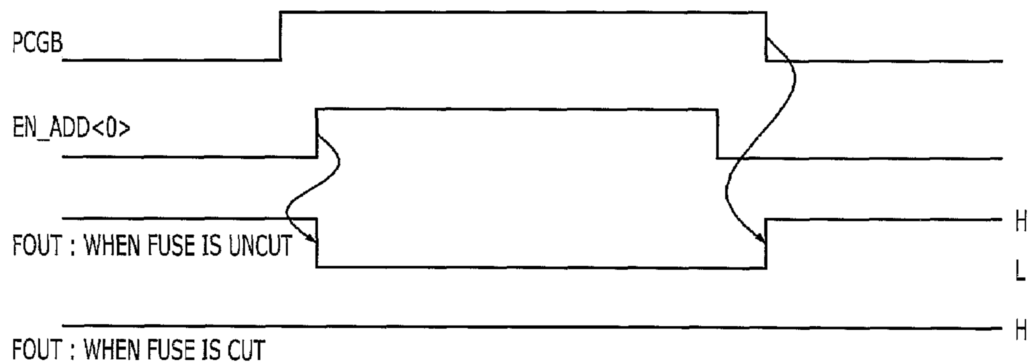
FIGS. 2 and 3 are timing diagrams for explaining an operation of the redundancy circuit of FIG. 1.
Figure 3:
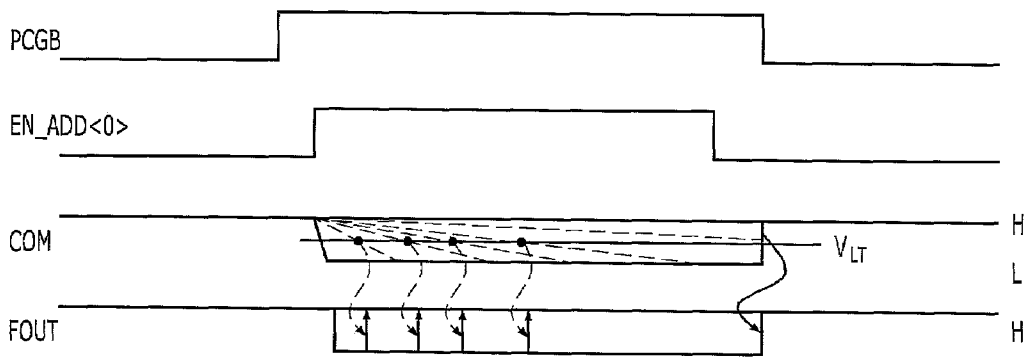
Figure 4:
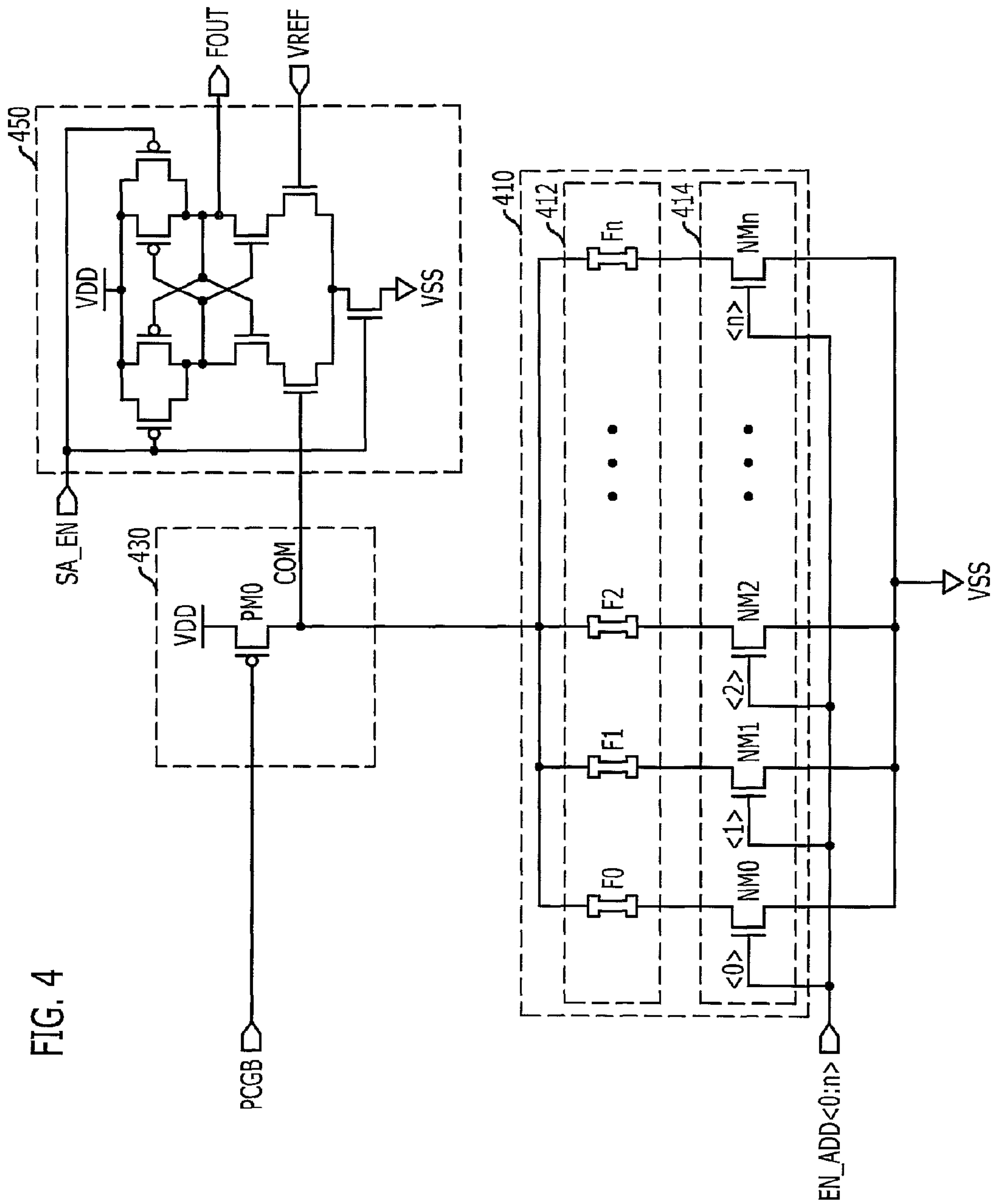
FIG. 4 is a circuit diagram illustrating a redundancy circuit in accordance with the present invention.

FIG. 4 is a circuit diagram illustrating a redundancy circuit in accordance with the present invention.

Referring to FIG. 4, the redundancy circuit of the present invention includes a fuse unit 410, a precharging unit 430, and a comparison unit 450.

The fuse unit 410 is for driving a common node COM serving as an output terminal through a current path including a fuse in response to a fuse enable signal EN_ADD<0:n>, and is provided with a plurality of fuses 412 and a plurality of activation portions 414.

The fuses 412 are for programming address information corresponding to memory cells in need of repair, and are composed of 0-th to n-th fuses F0, F1, F2, . . . , Fn. While the fuses are programmed with address information corresponding to memory cells in need of repair since a redundancy circuit is taken as an example in FIG. 4 for convenience of explanation, fuses used for other circuit operations are preferably programmed with corresponding different information. Also, the number of fuses constituting the fuses 412 may be varied depending on design.

The activation portions 414 are connected to the corresponding 0-th to n-th fuses F0, F1, F2, . . . , Fn, respectively, for activating the 0-th to n-th fuses F0, F1, F2, . . . , Fn in response to the fuse enable signal EN_ADD<0:n>, and are composed of 0-th to n-th NMOS transistors NM0, NM1, NM2, NMn.

The precharging unit 430 is for precharging the common node COM in response to a precharging signal PCGB, and has a source-drain path formed between an external power supply voltage VDD terminal and the common node COM and a 0-th PMOS transistor PM0 receiving the precharging signal PCGB via its gate.

The comparison unit 450 is activated in response to an activation signal SA_EN, and compares a predetermined reference voltage VREF with a voltage level of the common node COM to generate a repair information signal FOUT. Here, the comparison unit 450 may be composed of a latched differential sense amplifier, and the predetermined reference voltage VREF to be inputted to the latched differential sense amplifier may be generated at a user-desired voltage level from outside or inside a semiconductor device and then applied. Further, the repair information signal FOUT is a fuse state signal having a voltage level corresponding to the state of a fuse, and has address information corresponding to the memory cells in need of repair in the example of FIG. 4. The semiconductor device determines whether a memory cell desired to be accessed is a memory cell in need of repair or not in response to the repair information signal FOUT.

Figure 5:
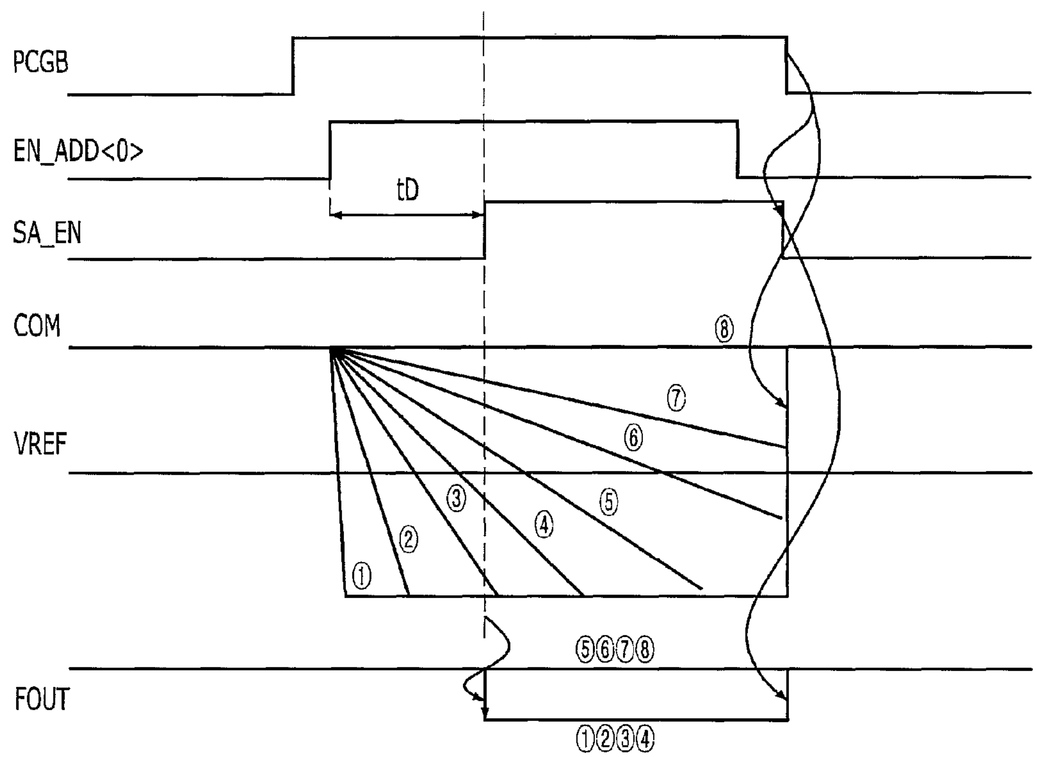
FIG. 5 is a waveform diagram showing an operation waveform of the redundancy circuit of FIG. 4.

FIG. 5 is a waveform diagram showing an operation waveform of the redundancy circuit of FIG. 4. For illustration purposes, the circuit operation will be described with respect to the 0-th fuse F0. The 0-th fuse F0 has various resistance values depending on a fuse cut state as described above.

Referring to FIGS. 4 and 5, firstly, the common node COM is precharged in response to a precharging signal PCGB of logic 'low', and thus it is kept at logic 'high'. Afterwards, the precharging signal PCGB is transited from logic 'low' to logic 'high' and deactivated during an active operation, a read operation, or a write operation, and the 0-th fuse enable signal EN_ADD<0> is activated to logic 'high'. Next, the 0-th NMOS transistor NM0 is turned on in response to the 0-th fuse enable signal EN_ADD<0>.

If the 0-th fuse F0 is not cut and thus has a normal low resistance state, the common node COM is rapidly transited to logic 'low' as shown in ①. If the 0-th fuse F0 is cut and thus has a normal high resistance state, the common node COM is kept at logic 'high' as shown in ⑧. Next, as shown in the drawings, if the resistance state of the 0-th fuse F0 are neither a high or low resistance state but has a different resistance that varies from a low resistance to a high resistance, the voltage level of the common node COM decrease with a gradient of ②, ③, ④, ⑤, ⑥, and ⑦ in this order.

In an interval where the activation signal SA_EN is logic 'low', the repair information signal FOUT is kept at logic 'high'. When the activation signal SA_EN is activated to logic 'high', the comparison unit 450 compares a voltage level of the common node COM with a voltage level of a reference voltage VREF to output the repair information signal FOUT. At this time, it is preferable that the activation signal SA_EN is activated since tD after the 0-th fuse enable signal EN_ADD<0> is activated for proper operation of the comparison unit 450. In the present invention, a state of the 0-th fuse F0 is outputted as the repair information signal FOUT at the time point of activation of the activation signal SA_EN.

In other words, at the time point of activation of the activation signal SA_EN, the comparison unit 450 compares a voltage level of the common node COM with a voltage level of the reference voltage VREF to output the repair information signal FOUT. That is, although the voltage level of the common node COM decreases with different gradients/slopes, the voltage level of the common node COM can be detected on the basis of the reference voltage VREF at the time point of activation of the activation signal SA_EN. Therefore, in case of ①, ②, ③, and ④, the repair information signal FOUT becomes logic 'low', and in case of ⑤, ⑥, ⑦, and ⑧, the repair information signal FOUT becomes logic 'high'. The redundancy circuit in accordance with the present invention can obtain an output result depending on a fuse state by regulating the activation time point of the activation signal SA_EN and the reference voltage VREF.

Figure 6:
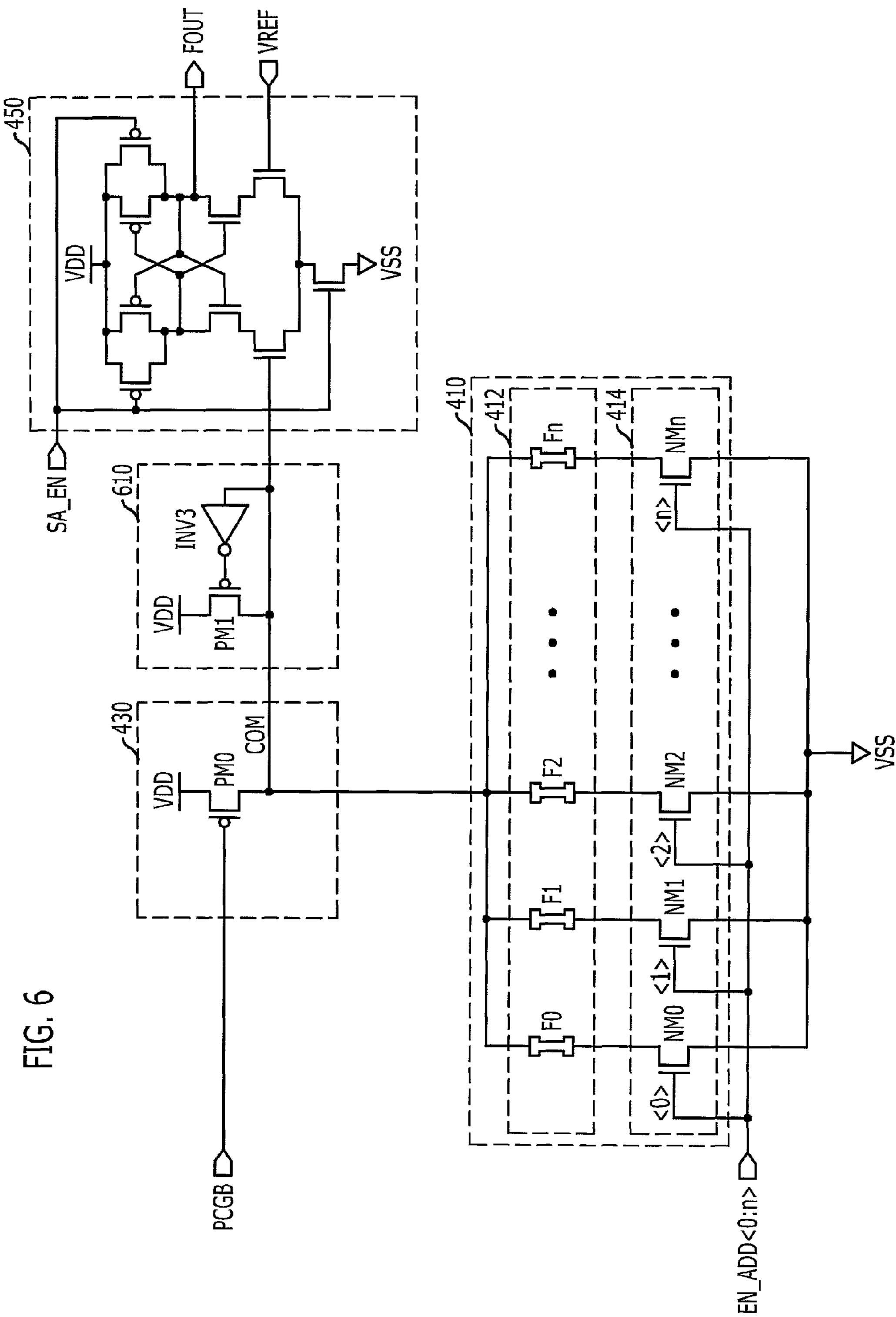
FIGS. 6 and 7 are circuit diagrams illustrating another embodiment of a redundancy circuit in accordance with the present invention.
Figure 7:
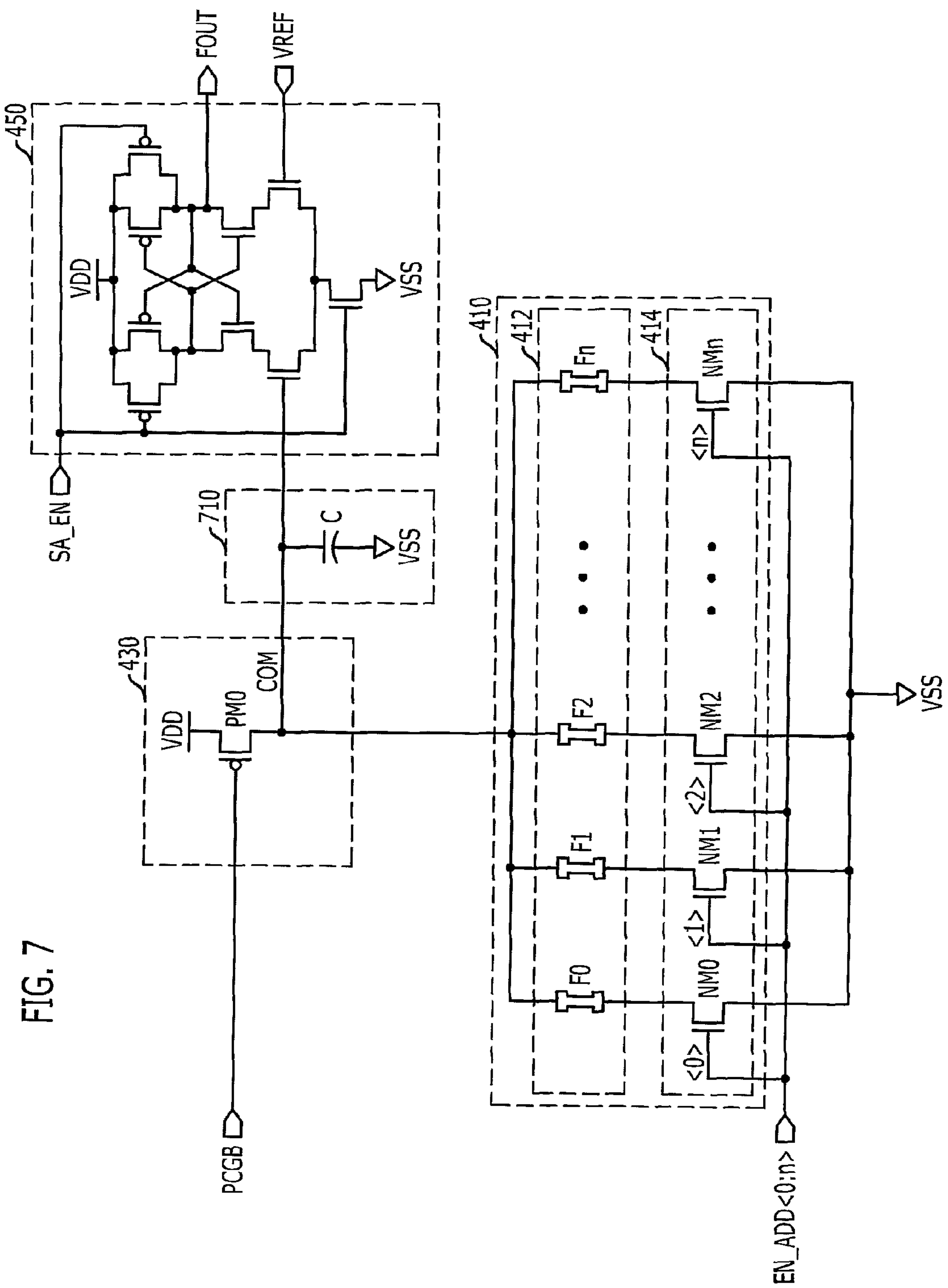

FIGS. 6 and 7 are circuit diagrams illustrating another embodiment of a redundancy circuit in accordance with the present invention. In FIGS. 6 and 7, auxiliary level maintaining units 610 and 710 are additionally provided in comparison with FIG. 4.

Referring to FIG. 6, the auxiliary level maintaining unit 610 is for maintaining the common node COM at a predetermined level, and is composed of a first PMOS transistor PM1 and a third inverter INV3. Thus, the first PMOS transistor PM1 drives the common node COM by a predetermined driving current.

In other words, the auxiliary level maintaining unit 610 is a component for supplementing the situation where the common node COM is made floating because the precharging signal PCGB becomes logic 'high', or the common node has to be kept at logic 'high' because the 0-th fuse F0, for example, has a high resistance state. The auxiliary level maintaining unit 610 is preferably designed with a size that can maintain the common node COM at an appropriate level to such an extent as to properly perform a pull-down operation on an uncut fuse. Hereinafter, another example of the auxiliary level maintaining unit 710 will be described with reference to FIG. 7.

Referring to FIG. 7, the auxiliary level maintaining unit 710 is also for maintaining the common node COM at a predetermined level, and is composed of a capacitor C connected between the common node COM and a ground power supply voltage VSS terminal. The capacitor C precharges the common node in an interval where the precharging signal PCGB is activated to logic 'low', and maintains the common node COM at an electric charge charged in the capacitor C in an interval where the precharging signal PCGB is deactivated to logic 'low'.

Figure 8:
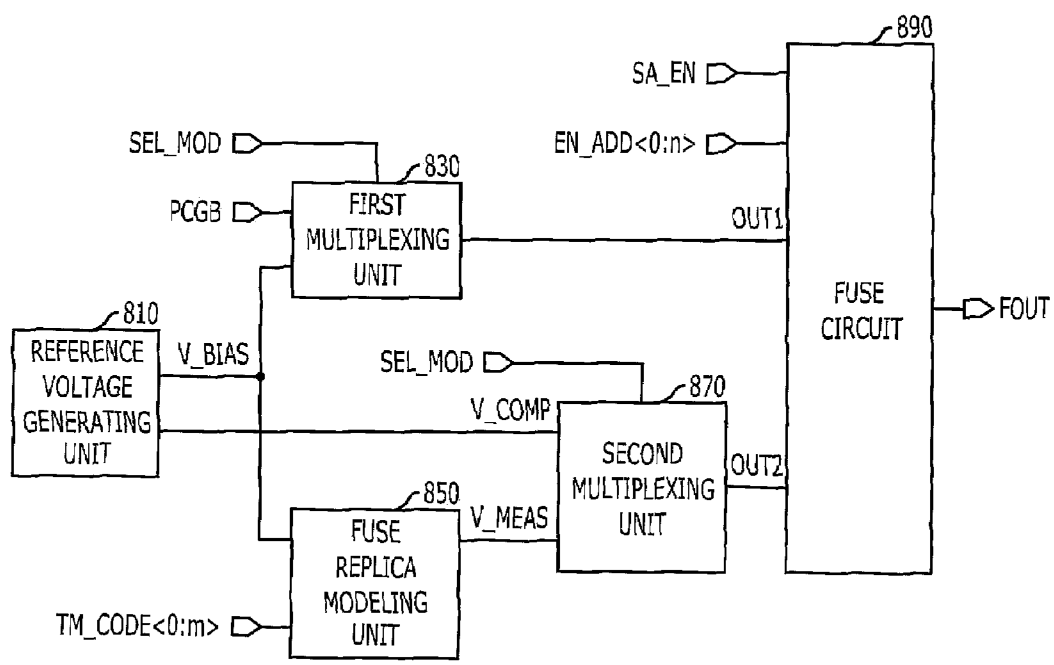
FIG. 8 is a block diagram illustrating a part of the configuration of a semiconductor device using the redundancy circuit of FIG. 4.

FIG. 8 is a block diagram illustrating part of the configuration of a semiconductor device employing the redundancy circuit of FIG. 4. The redundancy circuit in accordance with the present invention may be applied to other circuits depending on purpose, and the semiconductor device to be explained in FIG. 8 is a circuit capable of measuring a resistance value of a fuse. Therefore, the "redundancy circuit" explained in FIG. 4 is referred to as "fuse circuit" for FIG. 8, and designated by reference numeral 890.

Referring to FIG. 8, the semiconductor device includes a reference voltage generating unit 810, a first multiplexing unit 830, a fuse replica modeling unit 850, a second multiplexing unit 870, and a fuse circuit 890. The semiconductor device in accordance with the present invention has a normal mode and a measurement mode. Here, the normal mode is a mode in which the fuse circuit 890 performs the operation as shown in FIG. 4, and the measurement mode is a mode for measuring a resistance value of a fuse provided in the fuse circuit 890.

Hereinafter, each of the components will be described in detail.

The reference voltage generating unit 810 generates a bias voltage V_BIAS and a comparison reference voltage V_COMP, wherein the bias voltage V_BIAS and the comparison reference voltage V_COMP have a predetermined voltage level. As will be explained later, the bias voltage V_BIAS is used in the measurement mode and the comparison reference voltage V_COMP is used in the normal mode.

The first multiplexing unit 830 outputs a precharging signal PCGB or bias voltage V_BIAS in response to a mode selection signal SEL_MOD. The mode selection signal SEL_MOD may have a predetermined logic level depending on the normal mode and the measurement mode. In the normal mode, the first multiplexing unit 830 outputs the precharging signal PCGB as a first output signal OUT1, and in the measurement mode, outputs the bias voltage V_BIAS as a first output signal OUT1.

The fuse replica modeling unit 850 receives the bias voltage V_BIAS, and generates measured reference voltages V_MEAS having voltage levels corresponding to a plurality of measured resistance values in response to a resistance value selection signal TM_CODE<0:m> (where m is a natural number).

Figure 9:
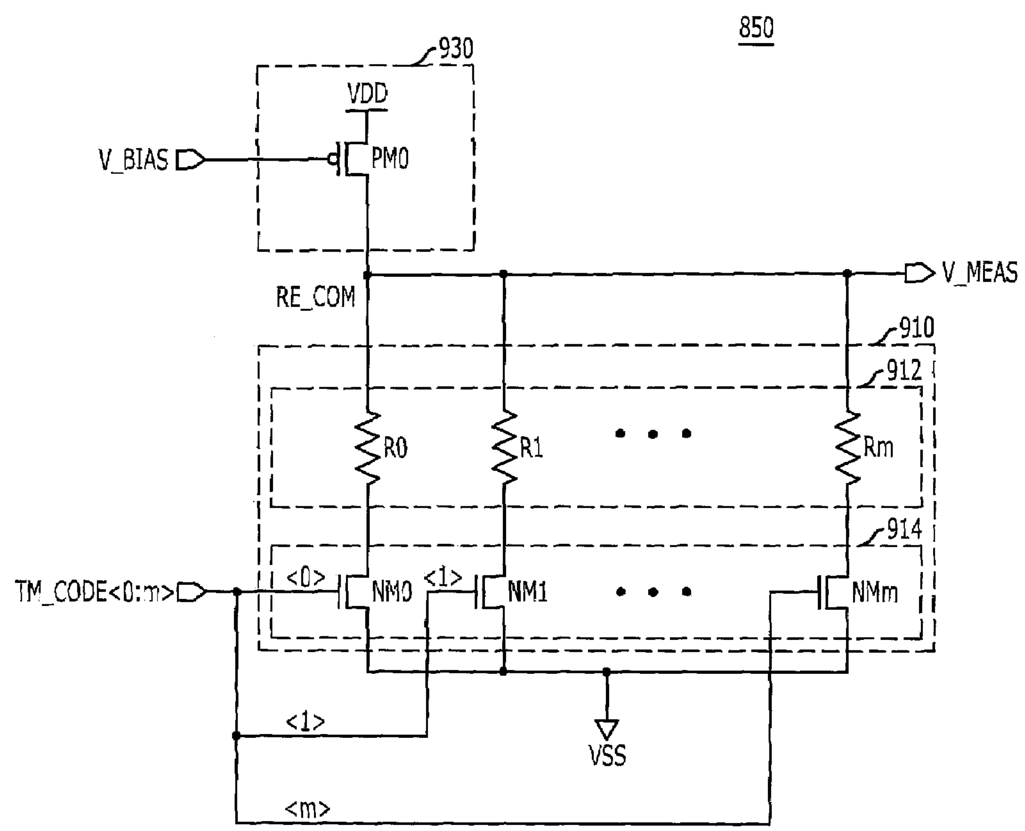
FIG. 9 is a detailed circuit diagram of the fuse replica modeling unit of FIG. 8.

FIG. 9 illustrates a detailed circuit diagram of the fuse replica modeling unit 850 depicted in FIG. 8.

Referring to FIG. 9, the fuse replica modeling unit 850 is provided with a replica resistor portion 910 and a replica biasing portion 930.

The replica resistor portion 910 is for driving a replica common node RE_COM serving as a replica output terminal through a current path including an activated replica resistor in response to a resistance value selection signal TM_CODE<0:m>, and is composed of a plurality of replica resistors 912 and a plurality of replica activation elements 914.

The replica resistors 912 have 0-th to m-th replica resistors R0, R1, . . . , Rm corresponding to measured resistance values. Here, the number of replica resistors and their respective resistance values may be changed to generate a measured reference voltage V_MEAS corresponding to a desired resistance voltage.

The replica activation elements 914 are connected to the corresponding 0-th to m-th replica resistors R0, R1, . . . , Rm, respectively, for activating the 0-th to m-th resistors R0, R1, . . . , Rm in response to a resistance value selection signal TM_CODE<0:m>, and have 0-th to m-th replica NMOS transistors NM0, NM1, . . . , NMm. The number of the 0-th to m-th replica NMOS transistors NM0, NM1, . . . , NMm is preferably designed to be equal to the number of the 0-th to m-th replica resistors R0, R1, . . . , Rm, and may be changed to generate a measured reference voltage V_MEAS corresponding to a desired resistance value.

The replica biasing portion 930 is for performing a bias operation on a replica common node RE_COM in response to a bias voltage V_BIAS, and is composed of a source-drain path formed between an external power supply voltage VDD terminal and the replica common node COM and a 0-th replica PMOS transistor PM0 receiving the bias voltage V_BIAS via its gate.

Now, a detailed description of the fuse replica modeling unit 850 of the present invention will be given below.

Referring again to FIG. 8, the second multiplexing unit 870 outputs a comparison reference voltage V_COMP or measured reference voltage V_MEAS in response to the mode selection signal SEL_MOD. That is, in the normal mode, the second multiplexing unit 870 outputs the comparison reference voltage V_COMP as a second output signal OUT2, and in the measurement mode, outputs the measured reference voltage V_MEAS as the second output signal OUT2.

The fuse circuit 890 receives a first output signal OUT1 of the first multiplexing unit 830, and compares a voltage level of an output terminal driven through a current path including a fuse with the second output signal OUT2 of the second multiplexing unit 870 in response to a fuse enable signal EN_ADD<0:n> to output a fuse state signal FOUT.

As will be explained later, in accordance with the present invention, the fuse state signal FOUT outputted from the fuse circuit 890 has information corresponding to the resistance value of a fuse desired to be measured in the measurement mode. Also, the fuse state signal FOUT outputted from the fuse circuit 890 has information corresponding to whether or not the fuse is cut in the normal mode. If the fuse circuit 890 is used as a redundancy circuit, it has address information of memory cells in need of repair.

Figure 10:
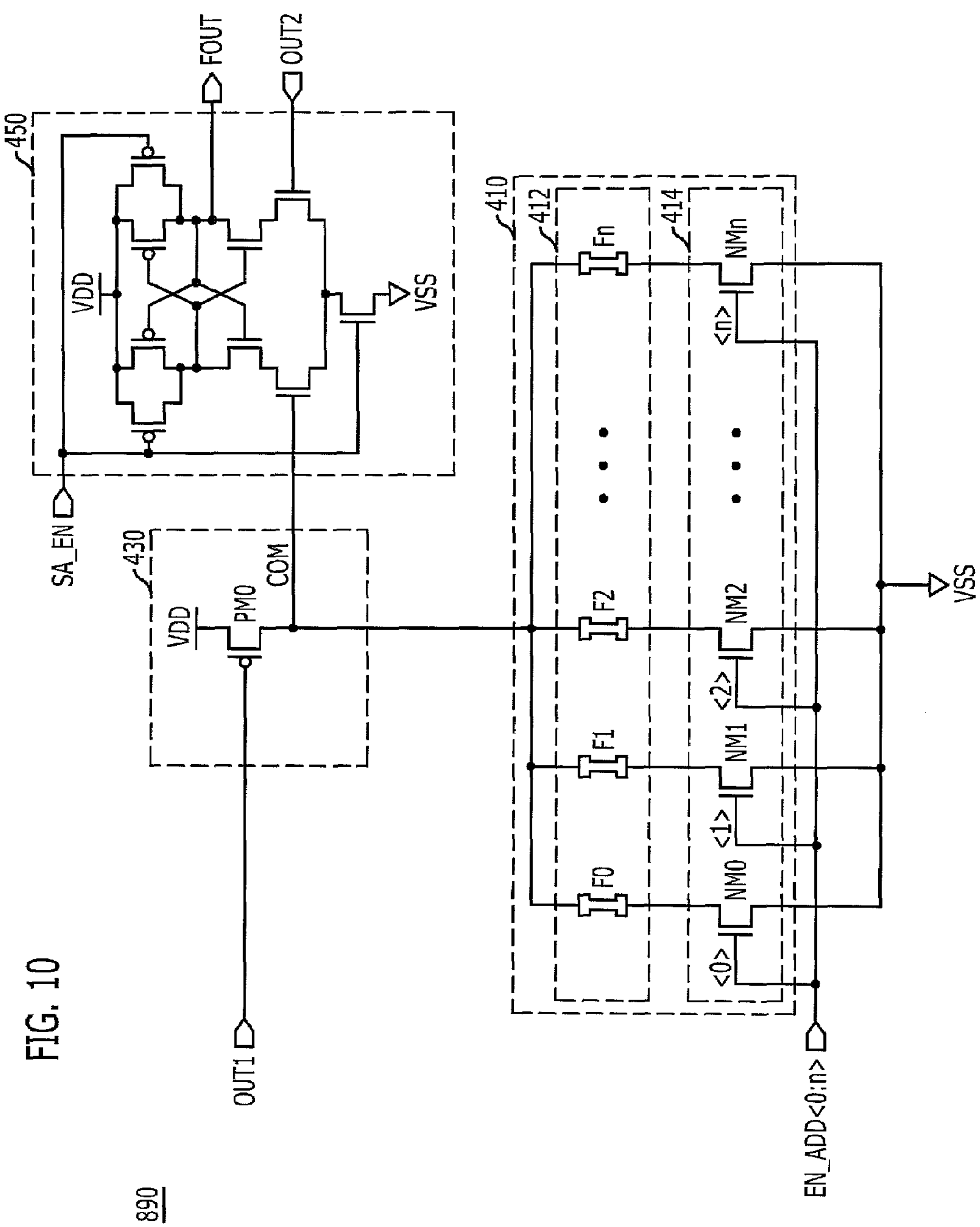
FIG. 10 is a detailed circuit diagram of the fuse circuit of FIG. 8.

FIG. 10 illustrates a detailed circuit diagram of the fuse circuit 890 of FIG. 8. The fuse circuit 890 of FIG. 10 has the same configuration as that of FIG. 4. That is, the fuse circuit 890 receives the first output signal OUT1 instead of the precharging signal PCGB of FIG. 4, and receives the second output signal OUT2 instead of the reference voltage VREF of FIG. 4. Here, the precharging unit 430 of FIG. 4 is equivalent to an output terminal driving unit 430 in FIG. 10. The output terminal driving unit 430 performs a precharging operation or biasing operation on the common node COM in response to the first output signal OUT1 of the first multiplexing unit 830 (see FIG. 8). That is, if the first output signal OUT1 is a precharging signal PCGB, the output terminal driving unit 430 performs a precharging operation on the common node COM, and if the first output signal OUT1 is a bias voltage V_BIAS, performs a biasing operation on the common node COM.

Hereinafter, an operation of the semiconductor device of FIG. 8 will be described in detail with reference to FIGS. 8 to 10.

First, in the normal mode, as described in FIG. 8, the first output signal OUT1 becomes a precharging signal PCGB, and the second output signal OUT2 becomes a comparison reference voltage V_COMP. Here, the comparison reference voltage V_COMP has the same characteristics as the reference voltage VREF of FIG. 4. Due to this, the semiconductor device in accordance with the present invention can perform the operation described in FIGS. 4 and 5 in the normal operation. At this time, an output fuse state signal FOUT has information corresponding to whether or not the corresponding fuse is cut, and this information may be address information of the memory cells in need of repair.

Next, in the measurement mode, the first output signal OUT1 becomes a bias voltage V_BIAS, and the second output signal OUT2 becomes a measured reference voltage V_MEAS. Here, the measured reference voltage V_MEAS is generated from the fuse replica modeling unit 850 of FIG. 9, and a description thereof is provided below.

Referring again to FIG. 9, the 0-th to m-th replica resistors R0, R1, . . . , Rm have measured resistance values which are to be measured when it is desired to measure resistance values of fuses of FIG. 10. For example, the 0-th to m-th replica resistors R0, R1, . . . , Rm may have different measured resistance values from each other. Based on these measured resistance values, it is possible to check the resistance value of a fuse which is cut or uncut.

In other words, depending on a resistance value selection signal TM_CODE<0:m>, the corresponding 0-th to m-th replica resistors R0, R2, . . . , Rm are activated, the replica common node RE_COM is driven through pull-up/pull-down current paths, and the replica common node RE_COM has voltage levels corresponding to the activated replica resistors. That is, the measured reference voltage V_MEAS has a voltage level corresponding to an activated replica resistor among the 0-th to m-th replica resistors R0, R1, . . . , Rm. Here, the pull-up current path indicates a current path using the 0-th replica PMOS transistor PM0 of the replica biasing portion 930 and the pull-down current path indicates a current path using an activated replica NMOS transistor and a replica resistor connected thereto.

It is preferable that the 0-th replica PMOS transistor PM0 of the replica biasing portion 930 and the PMOS transistor of the output terminal driving unit 430 of FIG. 10 are designed with the same characteristics. Also, it is preferable that the plurality of replica active portion 914 and the plurality of activation portions 414 of FIG. 10 are also designed with the same characteristics.

The common node COM of FIG. 10 performs a biasing operation in the measurement mode. That is, when any one of 0-th to n-th fuses F0, F1, F2, . . . , Fn is activated in response to a fuse enable signal EN_ADD<0:n>, the common node COM is driven through pull-up/pull-down current paths corresponding to the activated fuse, and the common node COM has a voltage level corresponding to the activated fuse. Here, the pull-up current path indicates a current path using the 0-th PMOS transistor, and the pull-down current path indicates a current path using an NMOS transistor activated by the fuse enable signal EN_ADD<0:n> and a fuse connected thereto.

A voltage level of the common node COM generated by the above operation and a measured reference voltage V_MEAS are compared in the comparison unit 450 that operates in response to an activation signal SA_EN, to output a fuse state signal FOUT. Here, if the voltage level of the common node COM is higher than the second output signal OUT2, i.e., the level of the measured reference voltage V_MEAS, the fuse state signal FOUT becomes logic 'high', and if the voltage level of the common node COM is lower than the level of the measured reference voltage V_MEAS, the fuse state signal FOUT becomes logic 'low'.

In other words, the measured reference voltage V_MEAS has a voltage level corresponding to an activated replica resistor among the 0-th to m-th replica resistors R0, R1, . . . , Rm, and this measured reference voltage V_MEAS is compared with a voltage level of the common node COM determined corresponding to a fuse whose resistance value is desired to be measured among the 0-th to n-th fuses F0, F1, F2, . . . , Fn, to generate a fuse state signal FOUT. At this time, the output fuse state signal FOUT has information corresponding to the resistance value of the fuse desired to be measured.

Hereinafter, a process of measuring a resistance value of a fuse having a given resistance value will be discussed in detail.

A measurement performer allows a measured reference voltage V_MEAS to have a voltage level corresponding to a resistance value of 10K by activating a replica resistor corresponding to the resistance value of 10 K for example. Meanwhile, a fuse whose resistance value is desired to be measured is activated, and the common node COM has a voltage level corresponding to a resistance value of the activated fuse. Therefore, if a certain resistance value of the activated fuse is less than 10 K, the voltage level of the common node COM is less than the measured reference voltage V_MEAS, and if a certain resistance value of the activated fuse is greater than 10 K, the voltage level of the common node COM is greater than the measured reference voltage V_MEAS. After that, when the comparison unit 450 is activated in response to an activation signal SA_EN, a fuse state signal FOUT obtained by a comparison of the voltage level of the common node COM and the voltage level of the measured reference voltage V_MEAS is outputted. The measurement performer can estimate the resistance value of the fuse based on the fuse state signal FOUT.

If the resistance value of the fuse desired to be measured corresponds to 15 K, the fuse state signal FOUT becomes logic 'high'. Through this, the measurement performer can understand that the resistance value of the fuse is greater than 10 K. Afterwards, the measurement performer can perform the measurement described above by activating a replica resistor corresponding to a resistance value greater than 10 K, e.g., 20 K. At this time, the fuse state signal FOUT becomes logic 'low'. As a result, the measurement performer can understand that the fuse whose resistance value is desired to be measured has a resistance value of greater than 10 K but less than 20 K.

Accordingly, the semiconductor device in accordance with the present invention can measure a resistance value of a fuse by the method described above.

Figure 11:
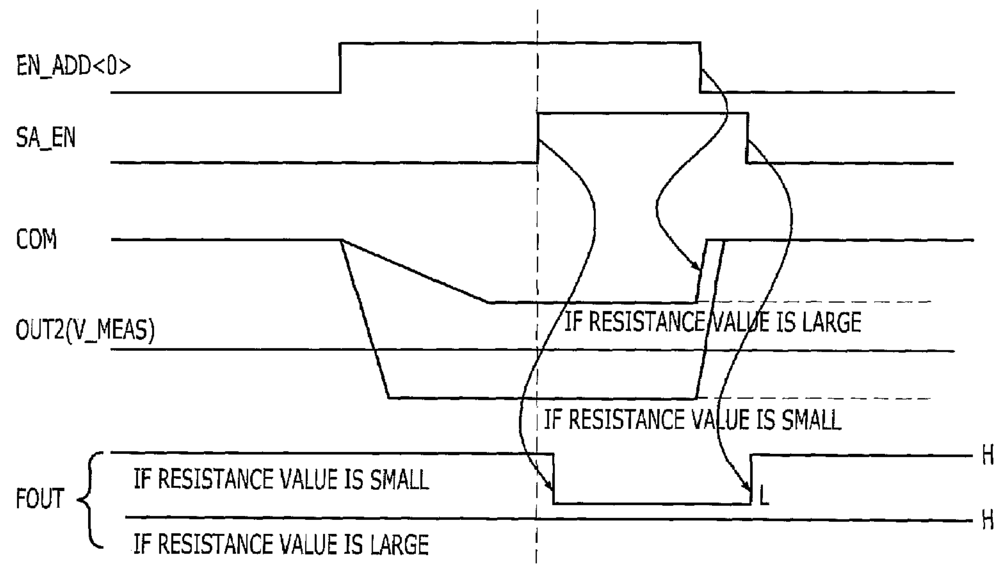
FIGS. 11 and 12 are waveform diagrams describing a circuit operation waveform of FIG. 10.
Figure 12:
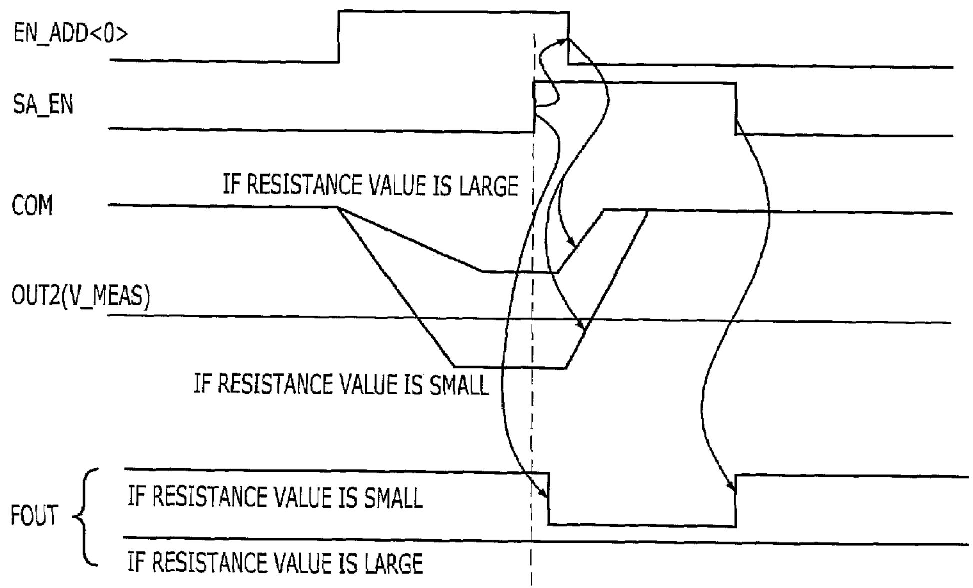

FIGS. 11 and 12 are waveform diagrams showing a circuit operation waveform of FIG. 10. For illustration purposes, an operating waveform in the measurement mode is shown, and it is assumed that the fuse whose resistance value is desired to be measured is the 0-th fuse F0 that is activated in response to the 0-th fuse enable signal EN_ADD<0>. For reference, the second output signal OUT has a measured reference voltage V_MEAS in the measurement mode. Here, the measured reference voltage V_MEAS has a voltage level predetermined by the measurement performer.

Referring to FIGS. 10 and 11, when the 0-th fuse enable signal EN_ADD<0> is activated, the voltage level of the common node COM is determined depending on the resistance value of the corresponding 0-th fuse F0. Here, an example is given in which, if the resistance value of the 0-th fuse F0 is large, the voltage level of the common node COM is greater than a measured reference voltage V_MEAS, and if the resistance value of the 0-th fuse F0 is small, the voltage level of the common node COM is less than the measured reference voltage V_MEAS.

Next, when the activation signal SA_EN is activated, the logic level of the fuse state signal FOUT is determined depending on the voltage level of the common node COM. That is, if the resistance value is small, the fuse state signal FOUT becomes logic 'low', and if the resistance value is large, the fuse state signal FOUT becomes logic 'high'.

FIG. 12 shows that an activation interval of the 0-th fuse enable signal EN_ADD<0> is different from that shown in FIG. 11. The semiconductor device in accordance with the present invention can reduce unnecessary power consumption in the operation of FIG. 11 through the activation interval of the 0-th fuse state signal FOUT as shown in FIG. 12.

Referring again to FIGS. 10 and 11, when the activation signal SA_EN is activated in a state where the 0-th fuse enable signal EN_ADD<0> is activated, a current path is formed through the 0-th PMOS transistor PM0, the 0-th fuse F0, and the 0-th NMOS transistor NM0, thereby causing the generation of continuous power consumption. However, if the 0-th fuse enable signal EN_ADD<0> is deactivated after the activation of the activation signal SA_EN as shown in FIG. 12, the 0-th NMOS transistor NM0 is turned off and thus no current path is formed, thereby preventing the generation of continuous power consumption. Preferably, the 0-th fuse enable signal EN_ADD<0> is deactivated by the activation signal SA_EN after the comparing operation of the comparison unit 450.

Figure 13:
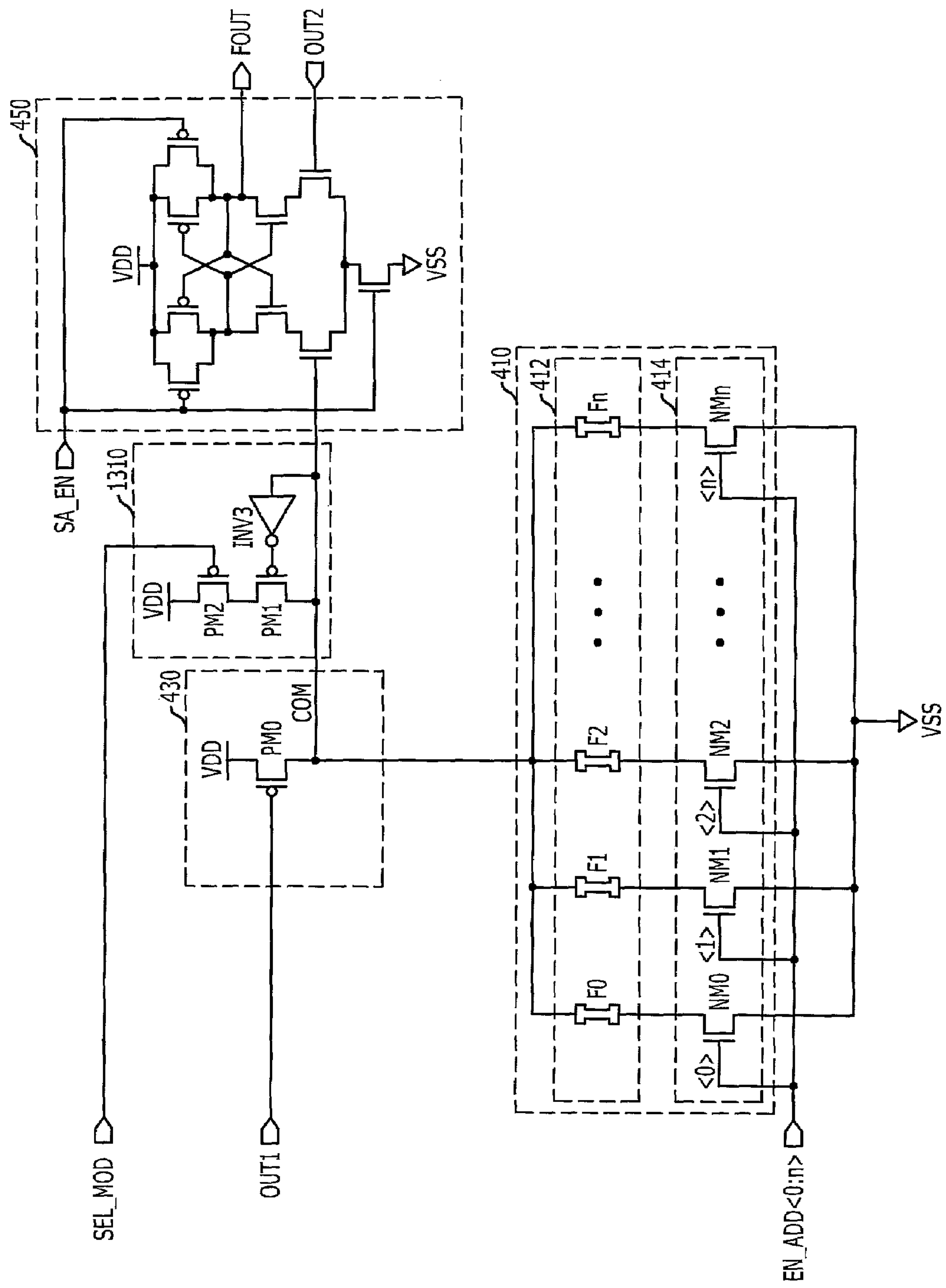
FIG. 13 is a circuit diagram illustrating another embodiment of a fuse circuit in accordance with the present invention.

FIG. 13 is a circuit diagram illustrating another embodiment of a fuse circuit in accordance with the present invention, in which the fuse circuit has the auxiliary level maintaining unit 610 as shown in FIG. 6. For illustration purposes, the auxiliary level maintaining unit is labeled as '1310'.

Referring to FIG. 13, the auxiliary level maintaining unit 1310 is for maintaining the common node COM at a predetermined level in the normal mode, and includes a first PMOS transistor PM1, a third inverter INV3, and a second PMOS transistor PM2. Since the first PMOS transistor PM1 and the third inverter INV3 have already been described with reference to FIG. 6, a detailed description thereof is omitted.

The second PMOS transistor PM2 is for controlling the activation operation of the auxiliary level maintaining unit 1310, and has a source-drain path between an external power voltage VDD terminal an the first PMOS transistor PM1 and receives a mode selection signal SEL_MOD via its gate. Thus, the second PMOS transistor PM2 is turned on in the normal mode, and turned off in the measurement mode. Accordingly, the auxiliary level maintaining unit 1310 is activated in the normal mode to maintain the common node COM at a predetermined level, and is deactivated in the measurement mode.

As described above, the semiconductor device in accordance with the present invention can output, in the normal mode, a result of whether or not a fuse programmed with desired information is cut or uncut at a desired time point, and thus improve the reliability of the semiconductor device using this result. Further, the semiconductor device in accordance with the present invention can measure a resistance value of a fuse desired to be measured in the measurement mode. Especially, a result obtained in the measurement mode enables fast analysis of the circuit, thereby shortening the product development period.

The above-described embodiments require the configuration as shown in FIG. 8 because a precharging operation is performed on the common node COM as shown in FIG. 10. However, in case of a fuse circuit driven by a biasing operation without performing a precharging operation in the normal mode, the first and second multiplexing units 830 and 870 of FIG. 10 may be modified without departing from the scope of the present invention.

Moreover, it should be noted that the logic gates and transistors exemplified in the above embodiments may be arranged in different places and implemented in different types based on polarities of input signals.

As a result, the present invention is able to produce an accurate output result corresponding to whether a programmed fuse is cut or uncut, thereby improving reliability in the operation of a semiconductor device utilizing the same.

In addition, the present invention enables circuit analysis by accurately measuring a resistance value of a fuse, thereby shortening the product development period.

While the present invention has been described with respect to the specific embodiments, it will be apparent to those skilled in the art that various changes and modifications may be made without departing from the spirit and scope of the invention as defined in the following claims.

What is claimed is:

1. A fuse circuit, comprising:

a fuse unit configured to drive an output terminal via a current path including a fuse in response to a fuse enable signal;

a comparison unit configured to be activated in response to an activation signal for comparing a reference voltage with a voltage of the output terminal of the fuse unit to generate a fuse state signal; and an auxiliary level maintaining unit configured to maintain the output terminal of the fuse unit at a predetermined level.

2. The fuse circuit as recited in claim 1, wherein the fuse unit includes:

a plurality of fuses configured to program desired information; and a plurality of activation portions configured to be connected to the corresponding plurality of fuses, respectively, for activating the plurality of fuses in response to the fuse enable signal.

3. The fuse circuit as recited in claim 1, wherein the comparison unit is a latched differential sense amplifier.

4. The fuse circuit as recited in claim 1, wherein the auxiliary level maintaining unit is configured to drive the output terminal with a predetermined driving current.

5. The fuse circuit as recited in claim 1, further comprising a precharging unit configured to precharge the output terminal in response to a precharging signal.

6. The fuse circuit as recited in claim 5, wherein the auxiliary level maintaining unit is configured to precharge the output terminal during a time interval that the precharging signal is activated.

7. The fuse circuit as recited in claim 5, wherein the activation signal is activated after the precharging signal is deactivated and the fuse enable signal is activated.

8. A semiconductor device, comprising:

a fuse circuit configured to compare a voltage level of an output terminal driven through a current path including a fuse with a measured reference voltage to generate a fuse state signal in response to a fuse enable signal; and a fuse replica modeling unit configured to generate the measured reference voltage having a voltage level corresponding to a measured resistance value of the fuse.

9. The semiconductor device as recited in claim 8, wherein the fuse circuit includes:

a fuse unit configured to drive the output terminal through a current path including the fuse in response to the fuse enable signal;

an output terminal driving unit configured to perform a biasing operation on the output terminal in response to a bias voltage; and a comparison unit configured to be activated in response to an activation signal for comparing the measured reference voltage with a voltage level of the output terminal to generate the fuse state signal.

10. The semiconductor device as recited in claim 9, wherein the fuse unit includes:

a plurality of fuses configured to program desired information; and a plurality of activation portions configured to be connected to the corresponding fuses, respectively, for activating the fuses in response to the fuse enable signal.

11. The semiconductor device as recited in claim 9, wherein the comparison unit is a latched differential sense amplifier.

12. The semiconductor device as recited in claim 9, further comprising an auxiliary level maintaining unit configured to maintain the output terminal at a predetermined level.

13. The semiconductor device as recited in claim 9, wherein the fuse replica modeling unit includes:

a replica resistor portion configured to drive a replica output terminal via a current path including replica resistors to generate the measured reference voltage in response to a resistance value selection signal; and a replica biasing portion configured to perform a biasing operation on the replica output terminal in response to the bias voltage.

14. The semiconductor device as recited in claim 13, wherein the replica resistor portion includes:

a plurality of replica resistors configured to correspond to the measured resistance value; and a plurality of replica activation elements configured to be connected to the corresponding replica resistors, respectively, for activating the replica resistors in response to the resistance value selection signal.

15. A semiconductor device, comprising:

a reference voltage generating unit configured to generate a bias voltage and a comparison reference voltage;

a first multiplexing unit configured to output a precharging signal or the bias voltage in response to a mode selection signal;

a fuse replica modeling unit configured to receive the bias voltage and generating a measured reference voltage having a voltage level corresponding to a measured resistance value in response to a resistance value selection signal;

a second multiplexing unit configured to output the comparison reference voltage or the measured reference voltage in response to the mode selection signal; and a fuse circuit configured to receive an output signal of the first multiplexing means and comparing a voltage level of an output terminal driven through a current path including a fuse with an output signal of the second multiplexing means to generate a fuse state signal in response to a fuse enable signal.

16. The semiconductor device as recited in claim 15, wherein the bias voltage and the comparison reference voltage have a predetermined voltage level.

17. The semiconductor device as recited in claim 15, wherein the mode selection signal is a signal corresponding to a normal mode and a measurement mode.

18. The semiconductor device as recited in claim 15, wherein the fuse replica modeling unit includes:

a replica resistor portion configured to drive a replica output terminal through a current path including replica resistors to generate the measured reference voltage in response to the resistance value selection signal; and a replica biasing portion configured to perform a biasing operation on the replica output terminal in response to the bias voltage.

19. The semiconductor device as recited in claim 18, wherein the replica resistor portion includes:

a plurality of replica resistors configured to correspond to the measured resistance value; and a plurality of replica activation elements configured to be connected to the corresponding replica resistors, respectively, for activating the replica resistors in response to the resistance value selection signal.

20. The semiconductor device as recited in claim 15, wherein the fuse circuit includes:

a fuse unit configured to drive the output terminal through a current path including the fuse in response to the fuse enable signal;

an output terminal driving unit configured to perform a precharging or biasing operation on the output terminal in response to an output signal of the first multiplexing unit; and a comparison unit configured to be activated in response to an activation signal for comparing an output signal of the second multiplexing unit with a voltage level of the output terminal to generate a fuse state signal.

21. The semiconductor device as recited in claim 20, wherein the output terminal driving unit performs a biasing operation on the output terminal in response to the bias voltage, and a precharging operation on the output terminal in response to the precharging signal.

22. The semiconductor device as recited in claim 20, wherein the fuse unit includes:

a plurality of fuses configured to program desired information; and a plurality of activation portions configured to be connected to the corresponding fuses, respectively, for activating the fuses in response to the fuse enable signal.

23. The semiconductor device as recited in claim 20, wherein the comparison unit is a latched differential sense amplifier.

24. The semiconductor device as recited in claim 20, further comprising an auxiliary level maintaining unit configured to maintain the output terminal at a predetermined level in response to the mode selection signal.

25. The semiconductor device as recited in claim 24, wherein the auxiliary level maintaining unit is configured to drive the output terminal with a predetermined driving current.

26. The semiconductor device as recited in claim 20, wherein the activation signal is activated after the precharging signal is deactivated and the fuse enable signal is activated.

27. The semiconductor device as recited in claim 15, further comprising an auxiliary level maintaining unit configured to maintain the output terminal at a predetermined level in response to the mode selection signal.

28. The semiconductor device as recited in claim 27, wherein the auxiliary level maintaining unit is configured to drive the output terminal with a predetermined driving current.

29. A method for driving a semiconductor device, comprising:

comparing a voltage level of an output terminal driven through a current path including a fuse programmed with desired information with a predetermined comparison reference voltage to output a result of whether the fuse is cut or uncut in a normal mode; and performing a biasing operation on the output terminal to output a result corresponding to a resistance value of the fuse in a measurement mode.

30. The method as recited in claim 29, wherein said comparing a voltage level of an output terminal includes:

performing a precharging operation on the output terminal in response to a precharging signal;

activating the fuse to drive the output terminal in response to a fuse enable signal; and comparing a voltage level of the output terminal with the comparison reference voltage to output a comparison result in response to an activation signal.

31. The method as recited in claim 30, wherein the activation signal is activated after the precharging signal is deactivated.

32. The method as recited in claim 29, wherein said performing a biasing operation on the output terminal includes:

activating the fuse in response to a fuse enable signal;

generating a measured reference value having a voltage level corresponding to a measured resistance value; and comparing a voltage level of the output terminal with the measured reference voltage to output a comparison result in response to an activation signal.

33. The method as recited in claim 32, wherein the activation signal is activated after the fuse enable signal is activated.

34. The method as recited in claim 32, wherein said generating a measured reference value includes:

activating a replica resistor corresponding to the measured resistance value in response to a resistance value selection signal; and generating the measured reference value through a current path including an activated replica resistor.

* * * * *